(12) United States Patent
Kure et al.

(10) Patent No.: US 8,581,379 B2
(45) Date of Patent: Nov. 12, 2013

(54) LEAD FRAME AND SEMICONDUCTOR DEVICE

(75) Inventors: Muneaki Kure, Nagano-ken (JP); Takashi Yoshie, Nagano-ken (JP); Masayuki Okushi, Nagano-ken (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/421,120

(22) Filed: Mar. 15, 2012

(65) Prior Publication Data

US 2012/0248591 A1 Oct. 4, 2012

(30) Foreign Application Priority Data

Mar. 29, 2011 (JP) ................................. 2011-073264

(51) Int. Cl.
*H01L 23/495* (2006.01)
(52) U.S. Cl.
USPC ........... 257/676; 257/666; 257/677; 257/766; 438/123
(58) Field of Classification Search
USPC .................. 257/676, 666, 677, 766, E23.054; 438/123, 111
See application file for complete search history.

(56) References Cited

U.S. PATENT DOCUMENTS

| | | | | |
|---|---|---|---|---|
| 5,882,955 A | * | 3/1999 | Huang et al. | 438/111 |
| 6,150,711 A | * | 11/2000 | Kom et al. | 257/677 |
| 7,408,248 B2 | | 8/2008 | Seki et al. | |

FOREIGN PATENT DOCUMENTS

| | | |
|---|---|---|
| JP | 4-115558 | 4/1992 |
| WO | 2005/117112 | 12/2005 |

* cited by examiner

*Primary Examiner* — Theresa T Doan
(74) *Attorney, Agent, or Firm* — Fish & Richardson P.C.

(57) ABSTRACT

A lead frame for a resin-seal type semiconductor device, which includes a semiconductor element having an electrode, a bonding wire connected to the electrode of the semiconductor element, and a sealing resin covering and sealing the semiconductor element and the bonding wire. The lead frame includes a substrate frame, a four-layer plating, and a three-layer plating. The substrate frame include leads, a connection region, which is sealed by the sealing resin and connected to the bonding wire, and an exposed region, which is not sealed by the sealing resin. A four-layer plating is applied to a portion of the substrate frame that is to be connected to the bonding wire and sealed by the sealing resin. A three-layer plating is applied to an exposed region of the substrate frame that is exposed from the sealing resin.

9 Claims, 13 Drawing Sheets

Before Reliability Test

Fig.7(b)

After Reliability Test

Fig.8(a)
Before Reliability Test

Fig.8(b)
After Reliability Test

Fig.9

|  | S (at%) | C (at%) | O (at%) | Ag (at%) | Pd (at%) | Ni (at%) | Cu (at%) | Au (at%) |
|---|---|---|---|---|---|---|---|---|
| Lead Frame 1 | 5.2 | 34.8 | 4.3 | - | 1.9 | 4 | 2.1 | 47.7 |
| Lead Frame 1D | 14.8 | 34 | 1.9 | 20 | - | 4.3 | 3.7 | 21.3 |

LEAD FRAME AND SEMICONDUCTOR DEVICE

CROSS-REFERENCE TO RELATED APPLICATIONS

This application is based upon and claims the benefit of priority from prior Japanese Patent Application No. 2011-073264, filed on Mar. 29, 2011, the entire contents of which are incorporated herein by reference.

BACKGROUND

The present invention relates to a lead frame and a semiconductor device.

A lead frame for a semiconductor device is used to mount a semiconductor element. After a semiconductor element is mounted on a lead frame, a semiconductor element is sealed with a sealing resin and integrating the semiconductor element with a lead frame. A semiconductor device is mounted on a substrates such as a printed wiring board or the like. A typical lead frame generally includes a die pad, onto which a semiconductor element is mounted, inner leads, which are electrically connected to electrodes of the semiconductor element through wire bonding, and outer leads, which serve as external connection terminals when mounting a semiconductor device onto a substrate. Such a lead frame is required to have a good bonding property with respect to the semiconductor element. Further, a bonding wire is required to have a good wire bonding property for connecting the semiconductor element to the inner leads, and the outer leads are required to have a good bonding property for bonding the semiconductor device to a mounting subject such as a substrate. Soldering is normally performed to mount a semiconductor device onto a substrate. Nowadays, widely used lead frames include solder films that are formed beforehand on the outer leads to improve the bonding property of the outer leads.

Figure 15:
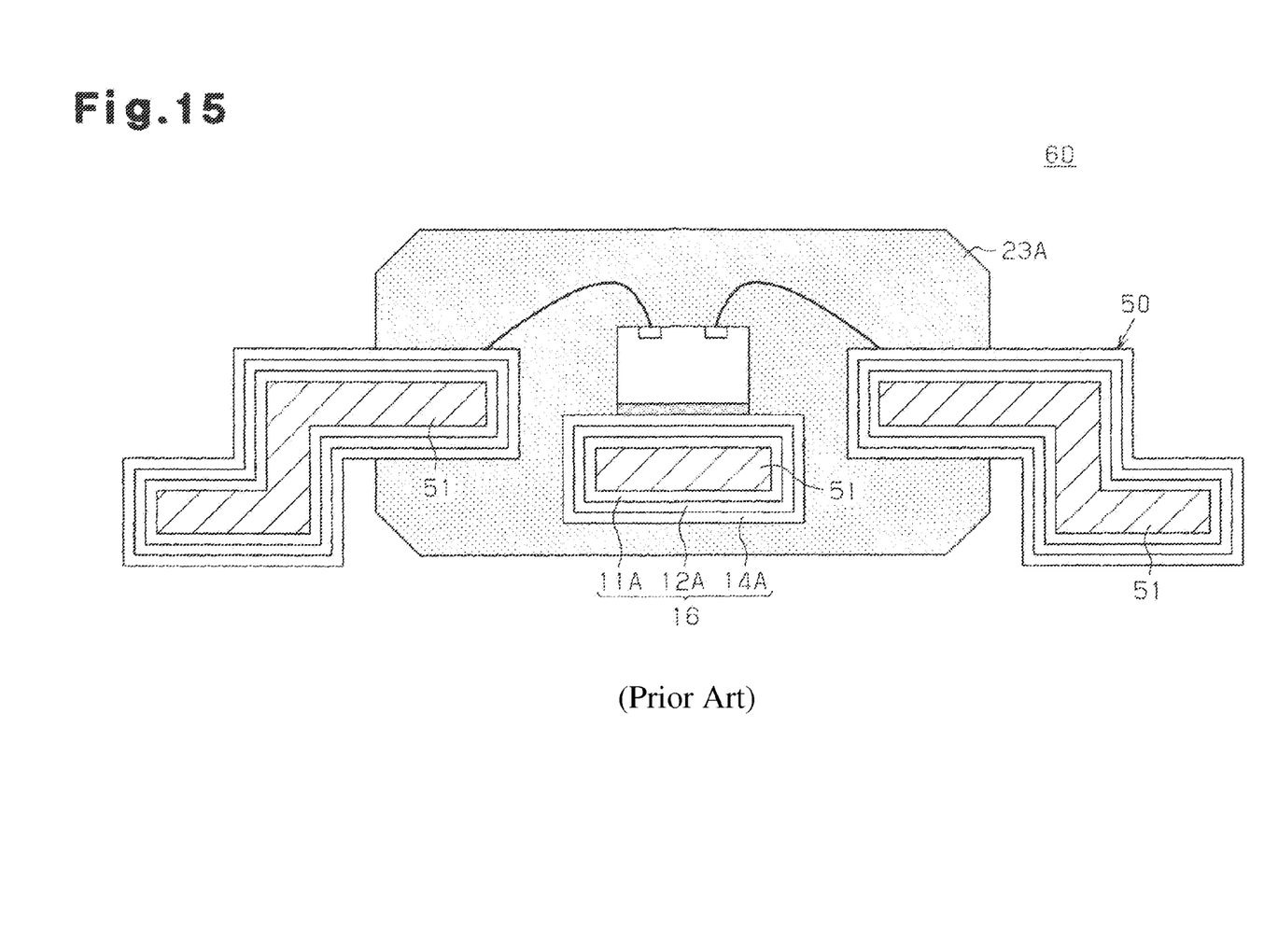
FIG. 15 is a cross-sectional view showing a conventional semiconductor device.

In contrast, lead frames that allow the mounting of semiconductor devices onto substrates without using solder films are also being used. For example, as shown in FIG. 15, a lead frame 50 includes a copper or copper alloy base material 51, a nickel plating layer 11A, which serves as a lowermost or substratum layer, a palladium plating layer 12A, and a gold plating layer 14A. The plating layers 11A, 12A and 14A are sequentially laminated on the copper or copper alloy base material 51 (refer to, for example, Japanese Laid-Open Patent Publication No. 4-115558 and International Publication No. WO2005/117112). The lead frame 50 of such a structure is referred to as a palladium pre-plated lead frame (Pd-PPF). In the lead frame 50, the gold plating layer 14A, which is formed as the uppermost layer, prevents oxidization of the lead frame and provides a good wire bonding property for a bonding wire (e.g., gold wire) that connects a semiconductor element to inner leads.

SUMMARY

Gold wires are often used as bonding wires. In recent years, however, the price of gold has increased sharply. As a result, the use of copper wires, which are less expensive than gold wires in terms of material cost, is rapidly increasing. Nevertheless, when compared with gold wires, copper wires are oxidized more easily, harder, and have a lower ductility. Thus, the wire bonding property of copper wires is poor. The lead frame 50 shown in FIG. 15 includes bonding portions having relatively hard surfaces. The inventors of the present invention have conducted research and concluded that copper wires often cause slipping when connecting the copper wires to the lead frame 50. Thus, copper wires are more difficult to bond than gold wires when used for wire bonding in the lead frame 50. Accordingly, the use of copper wires for wire boding in the lead frame 50 may result in a bonding failure or the like.

It is an object of the present invention to provide a lead frame and a semiconductor device that increases the connection reliability of a bonding wire.

One aspect of the present invention is a lead frame for a resin-seal type semiconductor device in which the semiconductor device includes a semiconductor element having an electrode, a bonding wire connected to the electrode of the semiconductor element, and a sealing resin covering and sealing the semiconductor element and the bonding wire. The lead frame includes a substrate frame, which includes a plurality of leads. A four-layer plating is applied to a portion of the substrate frame that is to be connected to the bonding wire and sealed by the sealing resin. The four-layer plating includes a first plating layer, which is formed from Ni or an Ni alloy, a second plating layer, which is formed from Pd or a Pd alloy, a third plating layer, which is formed from Ag or an Ag alloy, and a fourth plating layer, which is formed from Au or an Au alloy, sequentially laminated in this order on the portion of the substrate frame. A three-layer plating is applied to an exposed region of the substrate frame that is exposed from the sealing resin. The three-layer plating includes the first plating layer, the second plating layer, and the fourth plating layer sequentially laminated in this order on the exposed region of the substrate frame.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which:

FIG. 7($a$) is a diagram showing a semiconductor device before a reliability test, and FIG. 7($b$) is a view showing the semiconductor device after the reliability test;

FIG. 8($a$) is a diagram showing a semiconductor device before a reliability test, and FIG. 8($b$) is a view showing the semiconductor device after the reliability test;

DESCRIPTION OF THE EMBODIMENTS

Embodiments will now be described with reference to the accompanying drawings. The accompanying drawings schematically illustrate structures and do not depict actual scale. Further, plating layers are not shown with hatching lines in the cross-sectional views to facilitate understanding of the sectional structure of each member.

One embodiment will be described below with reference to FIGS. 1 to 10.

Lead Frame Structure

Figure 1:
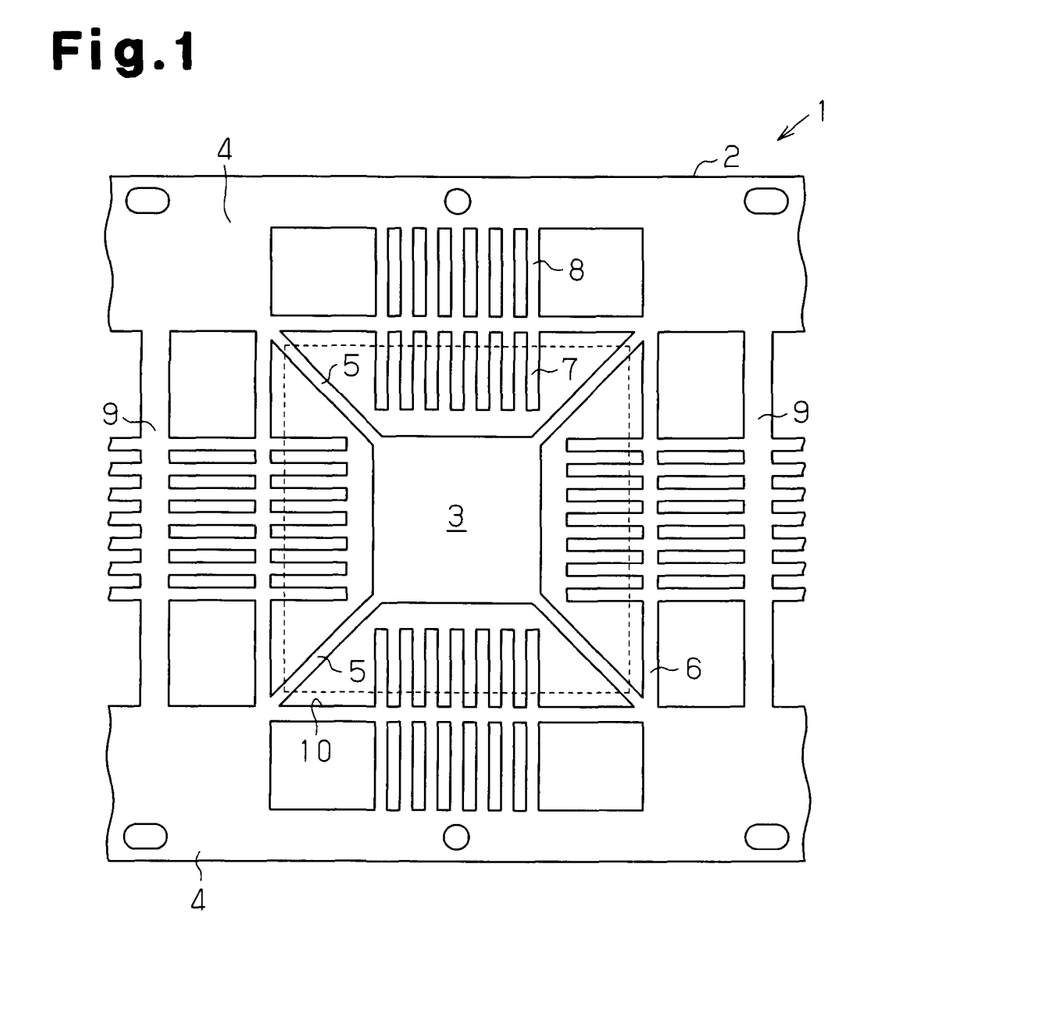
FIG. 1 is a plan view showing a lead frame in one embodiment.

FIG. 1 shows a lead frame 1, which is basically formed by a substrate frame 2, which is used as a substrate of a Quad Flat Package (QFP). The substrate frame 2 (base material) is formed from, for example, copper (Cu), a Cu-based alloy, a nickel-iron (Fe—Ni) binary alloy, or a Fe—Ni based multi-component alloy. The substrate frame 2 is obtained by, for example, pressing or etching a metal plate.

The substrate frame 2 includes a die pad 3, onto which a semiconductor element 21 (refer to FIG. 2) is mounted. The die pad 3 is formed to be tetragonal when viewed from above. The die pad 3 is supported by support bars 5, which are connected to rails 4, which are formed on both side edges of the substrate frame 2 extending in a longitudinal direction of the substrate frame 2. A plurality of inner leads 7, which are connected to dam bars 6, are arranged around the die pad 3. The dam bars 6 are connected to basal ends of a plurality of outer leads 8, and distal ends of the outer leads 8 are connected to the rails 4 or inner frames 9. The inner frames 9 each are extended perpendicular to and connected to the rails 4. The die pad 3, the support bars 5, the dam bars 6, the inner leads 7, and the outer leads 8 are defined by openings 10 formed in the substrate frame 2. In FIG. 1, the portion indicated by broken lines shows a resin sealing area, which is sealed by a sealing resin 23 (refer to FIG. 2). The die pad 3 and the inner leads 7 are sealed by the sealing resin 23, and the outer leads 8 are exposed from the sealing resin 23.

Figure 2:
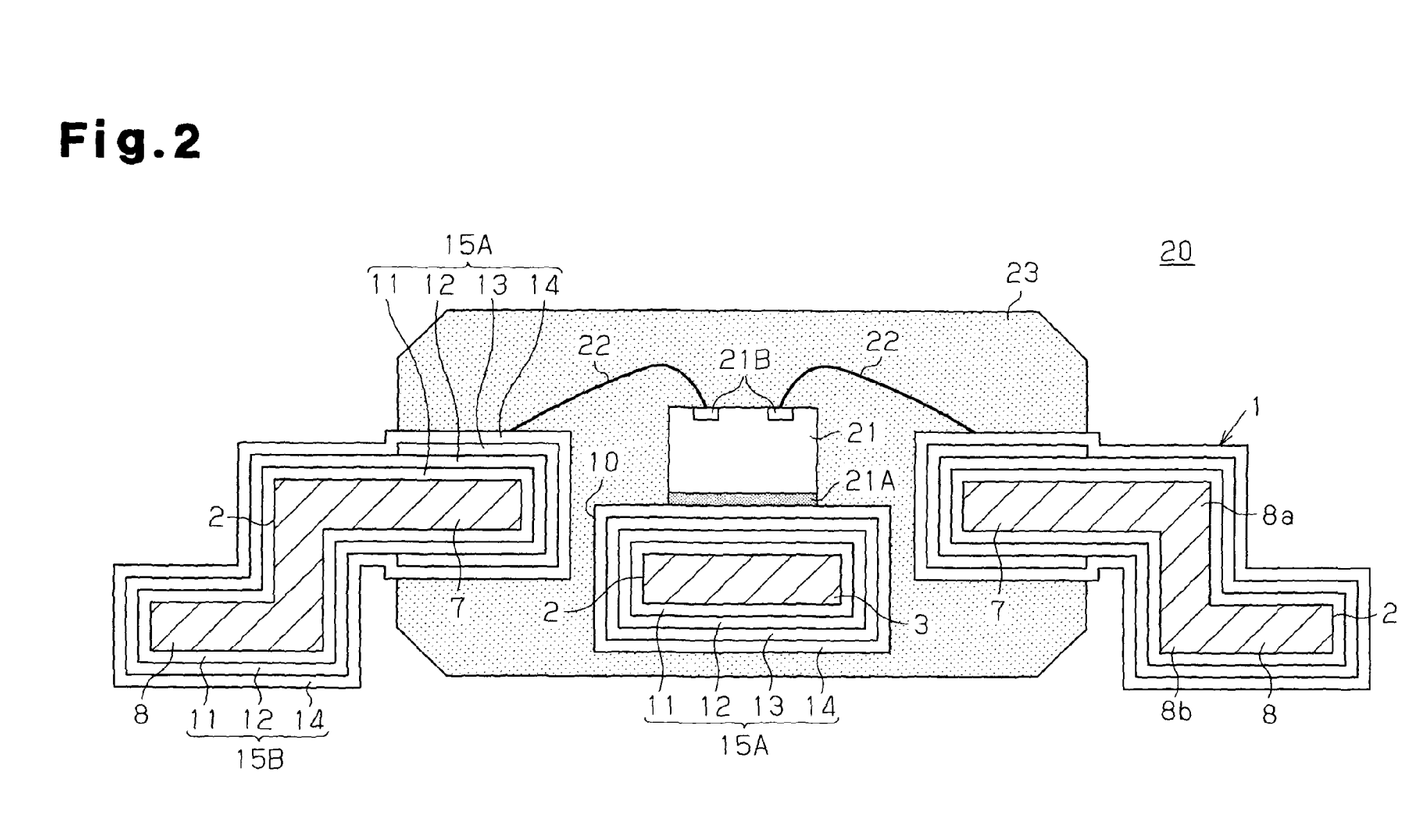
FIG. 2 is a cross-sectional view showing a semiconductor device of the embodiment.

As shown in FIG. 2, the die pad 3 is located at a lower position than the inner leads 7. The outer leads 8, which are formed integrally with the inner leads 7, are located at a lower position than the die pad 3. A first bent portion 8a and a second bent portion 8b may be formed in each outer lead 8 in which the first bent portion 8a is close to the inner leads 7. A bottom part of the outer lead 8 from the second bent portion 8b to the distal end serves as a mounting surface that is soldered and mounted onto a mounting substrate such as a printed wiring board.

Layer structures applied to the die pad 3, the inner leads 7, and the outer leads 8 will now be described.

As shown in FIG. 2, a four-layer plating 15A is applied to the die pad 3 and the inner leads 7, which are sealed by the sealing resin 23. The four-layer plating 15A includes a first plating layer 11, which is used as a substratum, a second plating layer 12, a third plating layer 13, and a fourth plating layer 14, which are sequentially laminated in this order. In the present embodiment, the first plating layer 11 is a nickel (Ni) plating layer, the second plating layer 12 is a palladium (Pd) plating layer, the third plating layer 13 is a silver (Ag) plating layer, and the fourth plating layer 14 is a gold (Au) plating layer. The four-layer plating 15A covers upper, lower, and side surfaces of the die pad 3 and the inner leads 7. A three-layer plating 15B is applied to the outer leads 8, which are exposed from the sealing resin 23. The three-layer plating 15B includes the first plating layer 11, which is used as a substratum, the second plating layer 12, and the fourth plating layer 14, which are sequentially laminated in this order. The three-layer plating 15B covers upper, lower, and side surfaces of the outer leads 8.

In this manner, the four-layer plating 15A, which includes the third plating layer 13 (Ag plating layer), is applied to the part of substrate frame 2 covered by the sealing resin 23 while the three-layer plating 15B, which does not include the third plating layer 13, is applied to the part of the substrate frame 2 exposed from the sealing resin 23. The first to fourth plating layers 11 to 14 can be formed through electrolytic plating, for example.

It is preferable that the first plating layer 11, which is the lowermost layer used as a substratum, be formed from a material and/or have a thickness determined taking into account the resistance to corrosion of the substrate frame 2, the adhesion characteristics with the second plating layer 12 that is formed from Pd, and the resistance to cracking of plated portion which is bent, and the like. As the material for the first plating layer 11, Ni, an Ni alloy, or the like can be used. From the viewpoint of the characteristics and manufacturing cost, the thickness of the first plating layer 11 is preferably in the range of 0.1 μm or greater to 3 μm or less, and more preferably, in the range of 0.2 μm or greater to 2 μm or less.

It is preferable that the second plating layer 12, which is the second layer from the base material, be formed from a material and/or have a thickness that suppresses diffusion and oxidization of the first plating layer 11 resulting from heat generated during assembling. As the material of the second plating layer 12 that realizes such functions, for example, Pd or a Pd alloy can be used. It is preferable that the thickness of the second plating layer 12 be in the range of 0.005 μm or greater to 0.2 μm or less to suppress diffusion and oxidization of the first plating layer 11 while minimizing thickness in view of manufacturing costs.

It is preferable that the third plating layer 13, which is the third layer from the base material, be formed from a material and/or have a thickness that increases the connection reliability to bonding wires 22. It is preferable that the material of the third plating layer 13 be a metal that relatively resists oxidization and has a low hardness. As the material of the third plating layer 13, for example, Ag or an Ag alloy can be used. To stably increase the connection reliability with respect to the bonding wires 22, the thickness of the third plating layer 13 is preferably in the range of 0.01 μm or greater to 3.5 μm or less, and more preferably in the range of 0.05 μm or greater to 3.5 μm or less.

It is preferable that the fourth plating layer 14, which is the fourth layer from the base material or the uppermost layer, be formed from a material and/or have a thickness that improves the connection reliability of the bonding wires 22. It is preferable that the material of the fourth plating layer 14 be a metal that relatively resists oxidization and has a low hardness. As the material of the fourth plating layer 14, for example, Au or an Au alloy can be used. To increase the connection reliability with respect to the bonding wire while minimizing thickness in view of manufacturing costs, the thickness of the fourth plating layer 14 is preferably in the range of 0.001 μm or greater to 0.1 μm or less, and more preferably in the range of 0.003 μm or greater to 0.01 μm or less.

Semiconductor Device Structure

As shown in FIG. 2, a resin-seal type semiconductor device 20 has a QFP structure produced with the lead frame 1. In the semiconductor device 20, the semiconductor element 21 is adhered with an adhesive 21A (e.g., Ag paste) onto the die pad 3 of the lead frame 1, specifically, the four-layer plating 15A formed on the surface of the die pad 3. The semiconductor element 21 includes electrodes 21B connected by the bonding wires 22 to the inner leads 7. In detail, the electrodes 21B of the semiconductor element 21 are electrically connected to the inner leads 7 via the bonding wires 22 and the first to fourth plating layers 11 to 14 (the plating 15A). The semiconductor element 21, the bonding wires 22, the die pad 3, and the inner leads 7 are covered and sealed by the sealing resin 23. In the semiconductor device 20, the outer leads 8 are exposed as external connection terminals from the sealing resin 23.

The semiconductor element 21 is, for example, an integrated circuit (IC) chip, a large scale integration (LSI) chip, or the like. In the illustrated example, only one semiconductor element is shown. However, when necessary, two or more semiconductor elements may be used. Moreover, any active or passive element may be used in lieu of or in combination with the semiconductor element. The bonding wires 22 may be, for example, Cu wires, Au wires, aluminum (Al) wires, or the like. The material of the sealing resin 23 may be, for example, an epoxy resin, polyimide resin, phenol resin, or acrylic resin.

Connection Reliability Evaluation

Evaluation results will now be described for the connection reliability (wire bonding property) of Cu wires with respect to the inner leads 7 to which the four-layer plating 15A is applied.

First, the tensile strength was measured for a Cu wire that was wire-bonded to an inner lead 7, in which the thickness of the first plating layer 11 was set to 1.0 μm, the thickness of the second plating layer 12 was set to 0.03 μm, the thickness of the third plating layer 13 was set to 0.1 μm, and the thickness of the fourth plating layer 14 was set to 0.008 μm (example 1). The tensile strength was also measured under the same conditions for a Cu wire of the prior art lead frame 50 to which a three-layer plating 16 was applied (refer to FIG. 15). In the lead frame 50, the thicknesses of the Ni plating layer 11A, the Pd plating layer 12A, and the Au plating layer 14A were respectively set to 1.0 μm, 0.03 μm, and 0.008 μm (comparative example 1). Further, the tensile strength was measured under the same conditions for a Cu wire of a lead frame in which a silver plating layer having a thickness of 5 μm was directly applied to a substrate frame formed from Cu or a Cu alloy (comparative example 2). The results are shown in FIG. 3.

The tensile strength is a value indicative of the load produced when the Cu wire delaminates or breaks during a tensile test conducted on a Cu wire stitch bond portion for a lead frame of which inner leads have undergone stitch bonding. A greater load results in a higher tensile strength, which indicates a higher connection reliability for the Cu wire.

Figure 3:
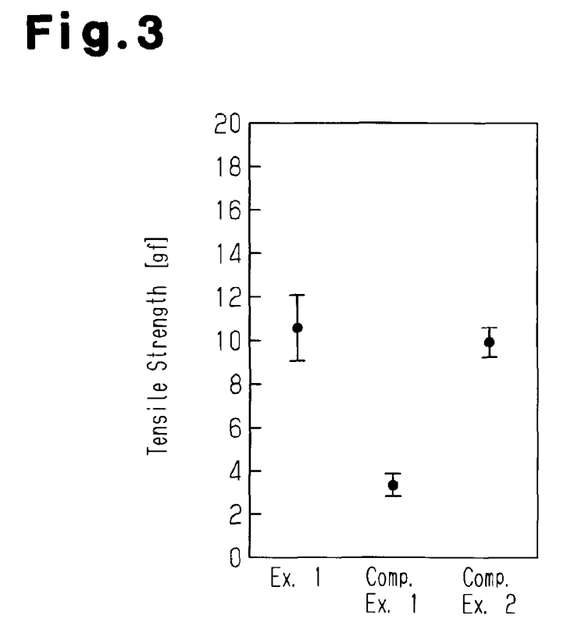
FIG. 3 is a graph showing the result of a connection reliability evaluation.

As is apparent from the results shown in FIG. 3, example 1 with the four-layer plating 15A obtains a tensile strength that is approximately three to four times greater than comparative example 1 with the three-layer plating 16. It is understood that this is because the addition of the third plating layer 13 (the Ag plating layer) decreases the hardness of the wire-bonded surface layer (fourth plating layer 14) of the inner lead 7. In detail, first, it is understood that the wire bonding property deteriorates when using a Cu wire in place of an Au wire due to the fact that the Cu wire is harder than the Au wire and slipping occurs when bonding the Cu wire. In this regard, in example 1 with the four-layer plating 15A, it can be understood that the presence of the third plating layer 13 (Ag plating layer) decreases the hardness of the surface layer thereby inducing plastic deformation at the lead frame side. This suppresses slipping of the Cu wire and allows for a good connection. This significantly increases the tensile strength from that of comparative example 1. In example 1, the thickness of the third plating layer 13 (Ag plating layer) is less than that of the Ag plating layer in comparative example 2. However, example 1 obtains about the same tensile strength as comparative example 2 and thus has practically sufficient tensile strength.

Figure 4:
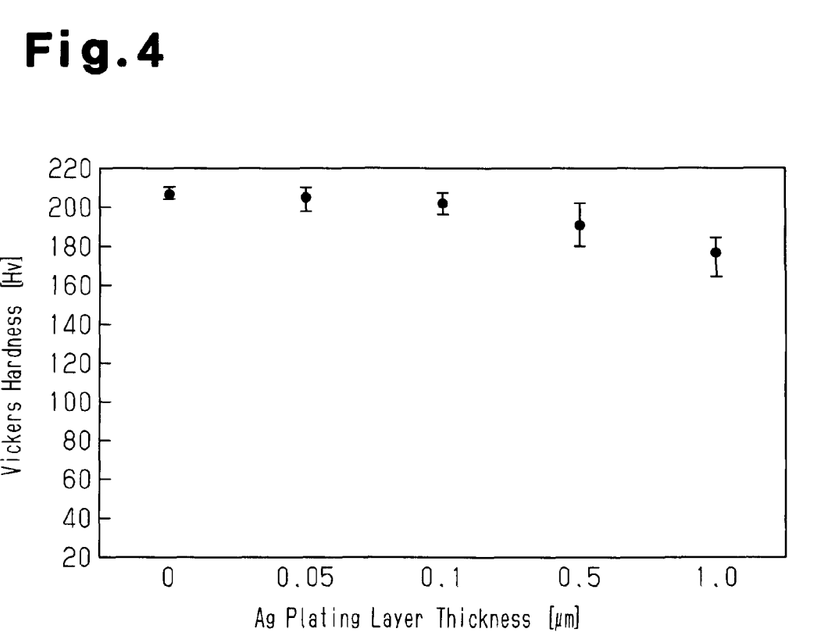
FIG. 4 is a graph showing a relationship between the thickness of an Ag plating layer and the Vickers hardness.
Figure 5:
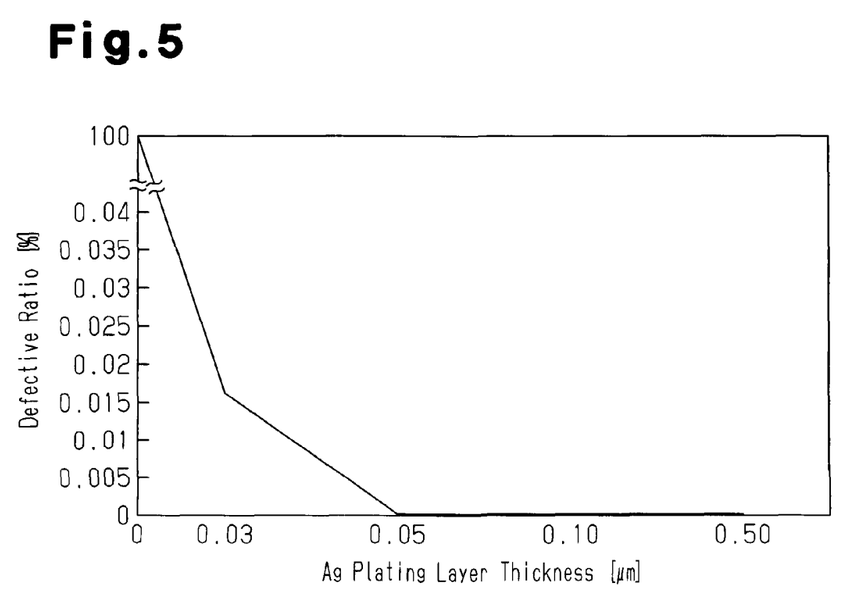
FIG. 5 is a graph showing the result of the connection reliability evaluation.

The hardness of the surface layer (fourth plating layer 14) of the inner lead 7 decreases as the thickness of the fourth plating layer 14 or third plating layer 13, which are formed from metals having a low hardness, increases. Thus, the wire bonding property can be improved by increasing the thicknesses of the fourth plating layer 14 and the third plating layer 13. FIGS. 4 and 5 show examples of evaluation results that support this observation.

FIG. 4 shows the relationship between the Vickers hardness and the thickness of the third plating layer 13 in the four-layer plating 15A formed on the inner lead 7. More specifically, the Vickers hardness was obtained when the thickness of the third plating layer 13 (Ag plating layer) was varied to 0 μm, 0.05 μm, 0.1 μm, 0.5 μm and 1.0 μm on the inner lead 7 in which the thickness of the first plating layer 11 was set to 0.8 μm, the thickness of the second plating layer 12 was set to 0.02 μm, and the thickness of the fourth plating layer 14 was set to 0.006 μm. For the measurement of the Vickers hardness, 50 gf was applied. A lower Vickers hardness value indicates a lower hardness. As apparent from the results shown in FIG. 4, the Vickers hardness decreases, that is, the hardness of the inner lead 7 decreases as the thickness of the third plating layer 13 increases.

FIG. 5 shows the relationship between the thickness of the third plating layer 13 in the four-layer plating 15A, which is formed on the inner lead 7, and the defective ratio, which indicates stitch separation after the tensile test. As is apparent from the results shown in FIG. 5, an increase in the thickness of the third plating layer 13 decreases the defective ratio, which indicates stitch separation. In particular, when the thickness of the third plating layer 13 is greater than or equal to 0.05 μm, the defective ratio, which indicates stitch separation, is zero (0). As apparent from these results, an increase in the thickness of the third plating layer 13 decreases the hardness of the surface layer of the inner lead 7 and improves the wire bonding property.

Figure 6:
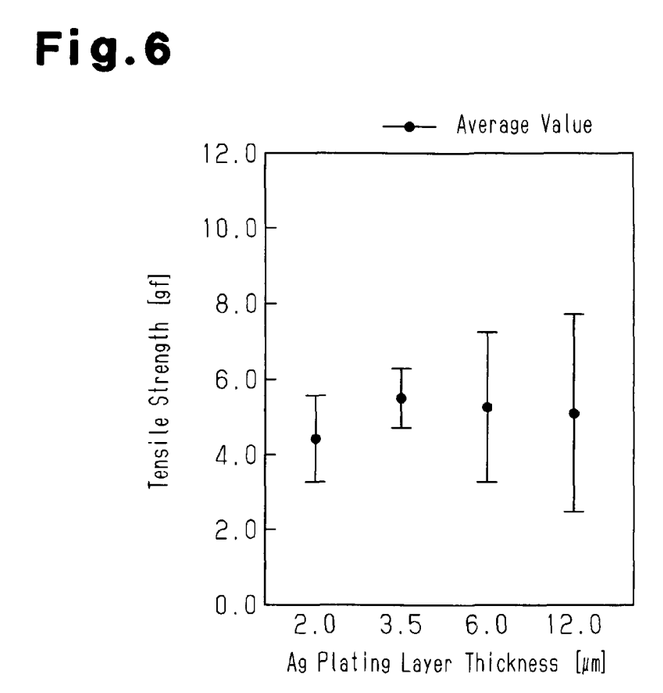
FIG. 6 is a graph showing the result of the connection reliability evaluation.

However, an increase in the thickness of the third plating layer 13 increases the manufacturing costs. In this regard, research was conducted to find an upper limit value for the thickness of the third plating layer 13. The result of the research is shown in FIG. 6. FIG. 6 shows the tensile strength when the thickness of the Ag plating layer, directly applied to a substrate frame formed from Cu or a Cu alloy, was varied to 2.0 μm, 3.5 μm, 6.0 μm, and 12.0 μm. As apparent from the result of FIG. 6, when the thickness of the Ag plating layer is greater than or equal to 2.0 μm, a practically sufficient tensile strength can be obtained for each case. However, when the thickness of the Ag plating layer exceeds 3.5 µm, variations in the tensile strength increase as the thickness of the Ag plating layer increases. Accordingly, from the result of FIG. 6, it is apparent that a high tensile strength can be stably obtained when the thickness of the Ag plating layer is set to 3.5 µm. The result of FIG. 6 is obtained when the Ag plating layer is directly applied to the substrate frame. However, the third plating layer 13 (Ag plating layer) in the four-layer structure greatly contributes to increasing the tensile strength. Thus, it can be understood that tensile strength having the same tendency as that shown in the result of FIG. 6 can be obtained when varying the thickness of the third plating layer 13 in the four-layer structure. In other words, in the inner lead 7 to which the four-layer plating 15A is applied, a high tensile strength may be stably obtained by setting the thickness of the third plating layer 13 to 3.5 µm. This obtains a high connection reliability.

As is apparent from the foregoing description, it is preferable that the thickness of the third plating layer 13 be set in the range of 0.05 µm or greater to 3.5 µm or less.

Reliability Evaluation

Figure 7A:
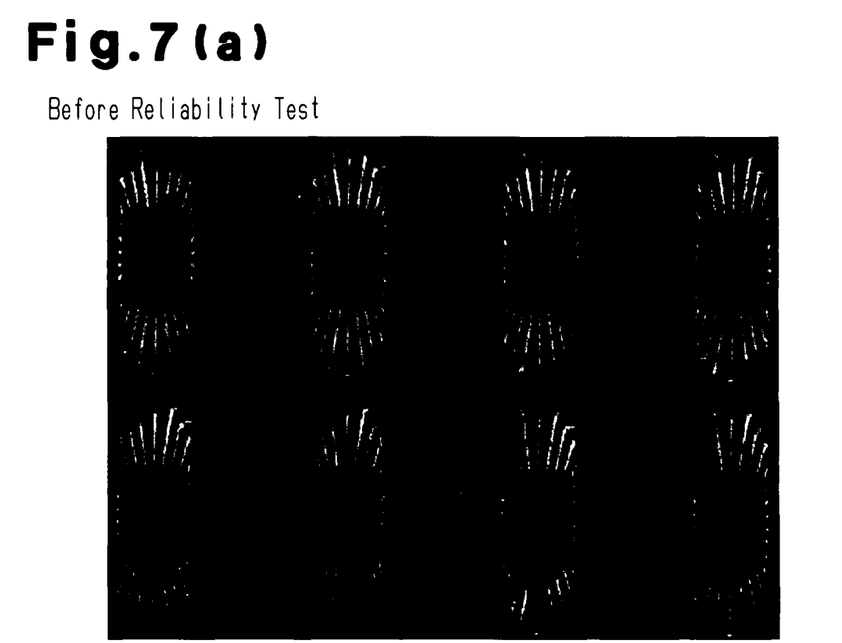
Figure 7B:
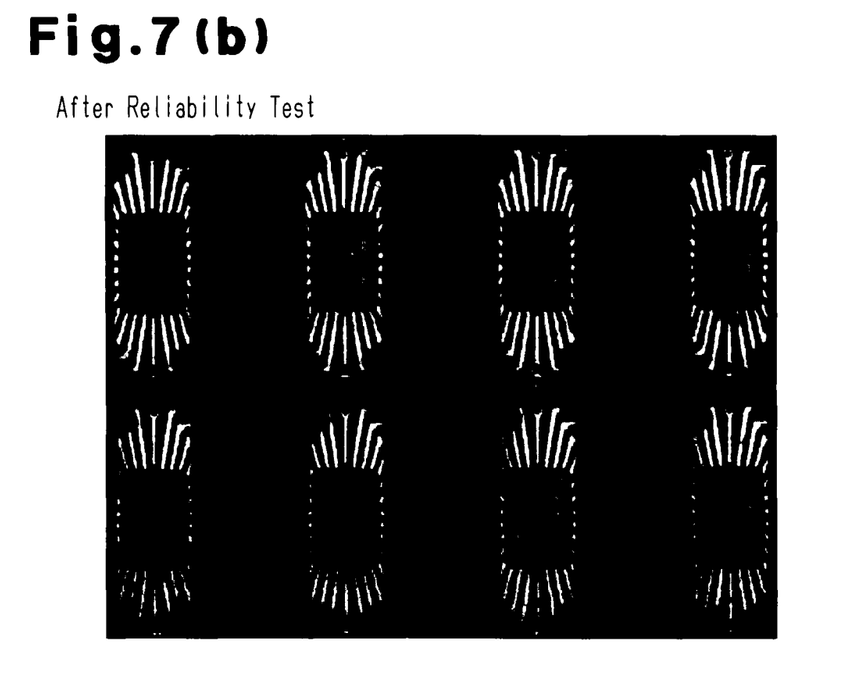
Figure 8A:
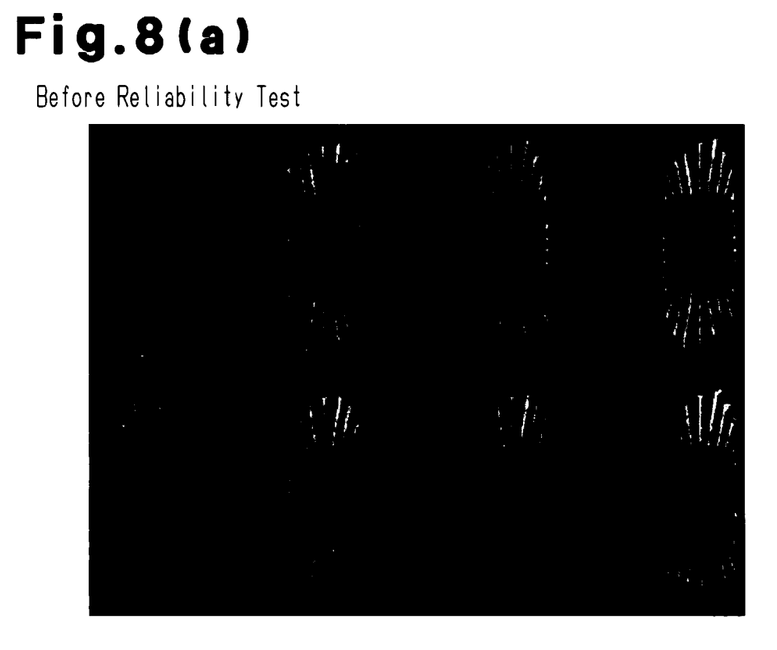
Figure 8B:
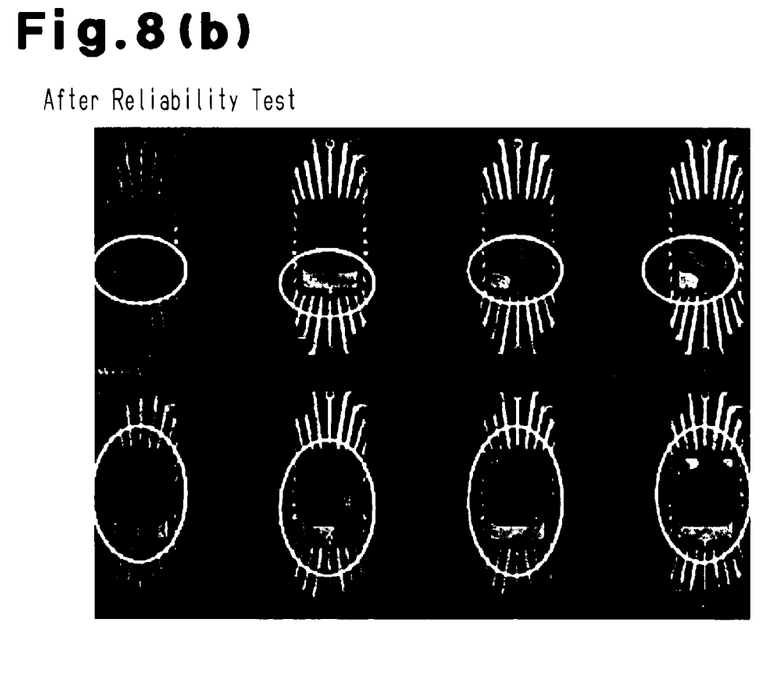

A reliability test (moisture absorption reflow test) was conducted on a semiconductor device with a four-layer plating (refer to FIG. 2), which includes an Ag plating layer and is applied to a substrate frame in a sealing resin, to evaluate the reliability of the semiconductor device. As a comparative example, the same evaluation was conducted on a semiconductor device with a three-layer plating that does not include an Ag plating layer and is applied to a substrate frame in a sealing resin (see FIG. 15). The reliability tests conducted on the two semiconductor devices were conducted under the same conditions except in whether or not the Ag plating layer was present. FIGS. 7 and 8 show results obtained with an ultrasonic testing device, such as a scanning acoustic tomograph (SAT), which checked for delamination between a sealing resin and a lead frame in the semiconductor device before and after the reliability test.

The reliability test was conducted under the following conditions.

Moisture absorption condition: JEDEC MSL 2a (60° C./60% RH×120 hrs)

Reflow condition: 260° C.×three times

As shown in FIGS. 7($a$) and 8($a$), in the two semiconductor devices that underwent the reliability test, it was confirmed that delamination did not occur between the sealing resin and the lead frame before the reliability test. As shown in FIG. 8($b$), however, in the semiconductor device with the three-layer plating, which does not include an Ag plating layer, in the sealing resin (refer to portions encircled in white), delamination was detected between the sealing resin and the lead frame in each die pad after the reliability test. In contrast, as shown in FIG. 7($b$), in the semiconductor device with the four-layer plating, which includes the Ag plating layer, in the sealing resin, delamination was not detected between the sealing resin and the lead frame in each die pad inspected after the execution of the reliability test. From these results, it is apparent that the reliability of the semiconductor device 20 shown in FIG. 2 can be improved by the application of the four-layer plating 15A, which includes the third plating layer 13 (Ag plating layer), to the substrate frame 2 in the region sealed by the sealing resin 23.

Reason Why Ag Plating Layer is not Formed on Outer Lead

Figure 16:
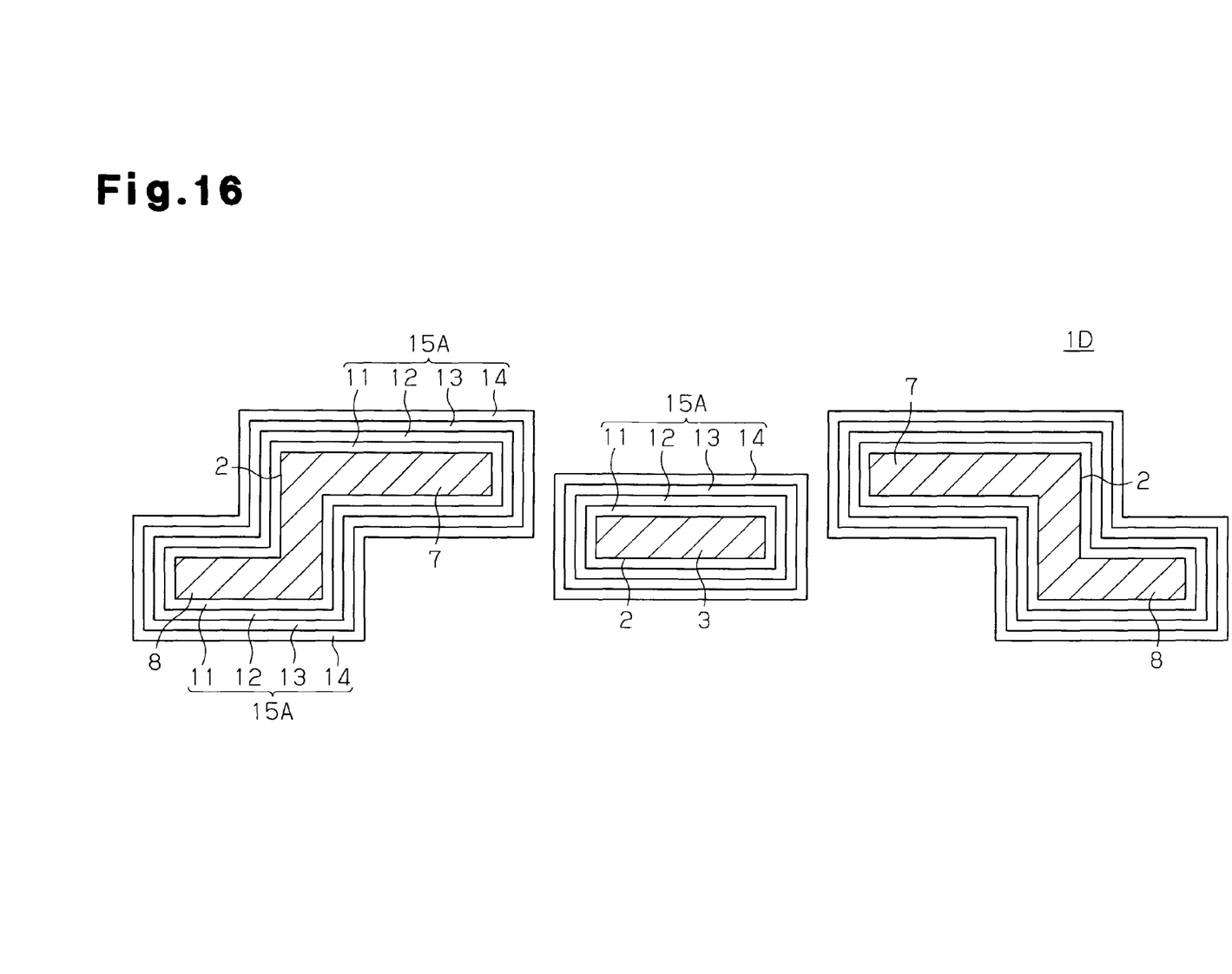
FIG. 16 is a cross-sectional view showing a lead frame of a comparative example.

In a structure in which the four-layer plating 15A is applied to the substrate frame 2, as shown in FIG. 16, a four-layer plating 15A can also be applied to the outer leads 8 in the same manner as the inner leads 7. In the present embodiment, however, the three-layer plating 15B, which does not including the third plating layer 13 (Ag plating layer), is intentionally applied to the outer leads 8, which are exposed from the sealing resin 23. The reasons for such a structure will now be described. That is, problems described below arise when the third plating layer 13 is formed on the outer leads 8, which are exposed from the sealing resin 23.

First Problem

When a lead frame is formed into a package and soldered to a substrate, the following problem may arise when the substrate side solder is a lead-free solder of Sn—Ag—Cu or the like. In detail, an $Ag_3Sn$ metallic compound is a relatively stable alloy and known as a lead-free solder having superior mechanical strength. However, the creep strength becomes excessively large when the Ag concentration in Sn exceeds 4% thereby resulting in a phenomenon such as land delamination of the substrate tending to occur. Further, when the Ag concentration in Sn exceeds 5%, shrinkage cavities, which may cause cracks, are produced. When the four-layer plating 15A including the third plating layer 13 (Ag plating layer) is formed on the outer leads 8 (mounting surface) of a lead frame 1D as shown in FIG. 16, a large amount of Ag is present in the soldered portion. This increases the Ag concentration, and land delamination and cracking is apt to occur.

Second Problem

Silver is generally known as a metal that is easily sulfurized. When the four-layer plating 15A that includes the Ag plating layer is formed on the outer leads 8, for example, Ag is thermally diffused in the surface layer of the lead frame 1D during assembling, and Ag and Au coexist with each other or are present as an alloy in the surface layer. Consequently, the lead frame 1D (particularly, each outer lead 8) is easily sulfurized. When the outer leads 8 are sulfurized, the wettability of the outer leads 8 and the solder deteriorates. This can be conformed from experimental results shown in FIGS. 9 and 10. The conditions and results of the experiments will now be described.

First, the lead frame 1 with the three-layer plating 15B applied to the outer leads 8 (refer to FIG. 2) and the lead frame 1D with the four-layer plating 15A applied to the outer lead 8 (see FIG. 16) were prepared. The lead frames 1 and 1D were heated under a condition suitable for assembling, and a gas test was conducted on the lead frames 1 and 1D.

Heating condition: temperature was continuously raised for 30 minutes from room temperature to 175° C. Then, heating was performed at 175° C. for 60 minutes in the atmosphere, and further heating was performed at 200° C. for two minutes over a hot plate.

Gas test: 100 ml of 6% sulfurous acid solution was put into a desiccator, and the lead frame was then left for 60 minutes in an $SO_2$ gas atmosphere produced by the solution. Thereafter, 100 ml of 2% ammonium hydrogen sulfide solution was put into a desiccator, and the lead frame was then left for 15 minutes in an $H_2S$ gas atmosphere produced by the solution.

Figure 9:
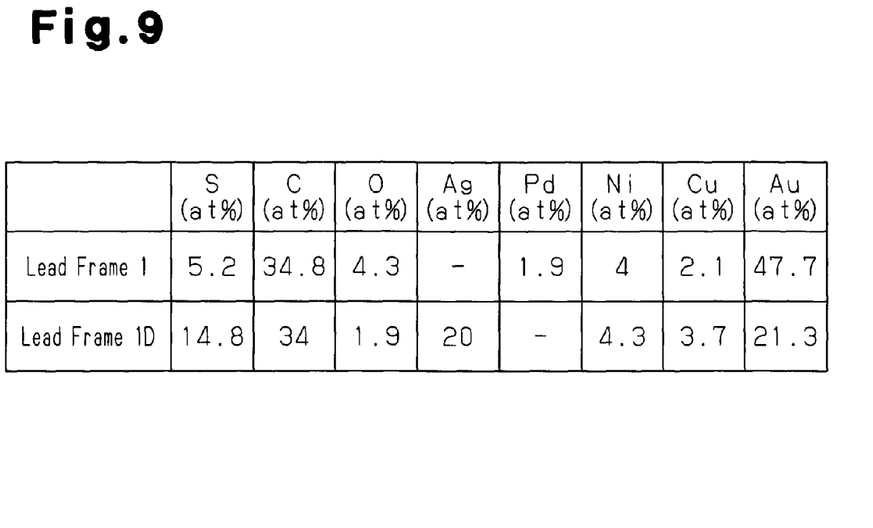
FIG. 9 is a table showing the result of an AES qualitative and quantitative analysis.

Auger electron spectroscopy (AES) surface analysis was conducted to quantitatively and qualitatively analyze elements present on the surface of an outer lead of the lead frame that underwent the gas test. The results are shown in FIG. 9. As apparent from the results, in the lead frame 1D having the Ag plating layer on the outer leads, the amount of sulfur (S) on the surface of the outer lead 8 is approximately three times greater than that of the lead frame 1 including no Ag plating layer on the outer lead. Accordingly, it is apparent that the outer leads are apt to being sulfurized due to the presence of the Ag plating layer.

Further, a meniscograph test was conducted to measure the zero cross time for the lead frames that underwent the gas test.

This test (evaluation of a solder wettability), which measured the zero cross time, was conducted under the following conditions.

Figure 10:
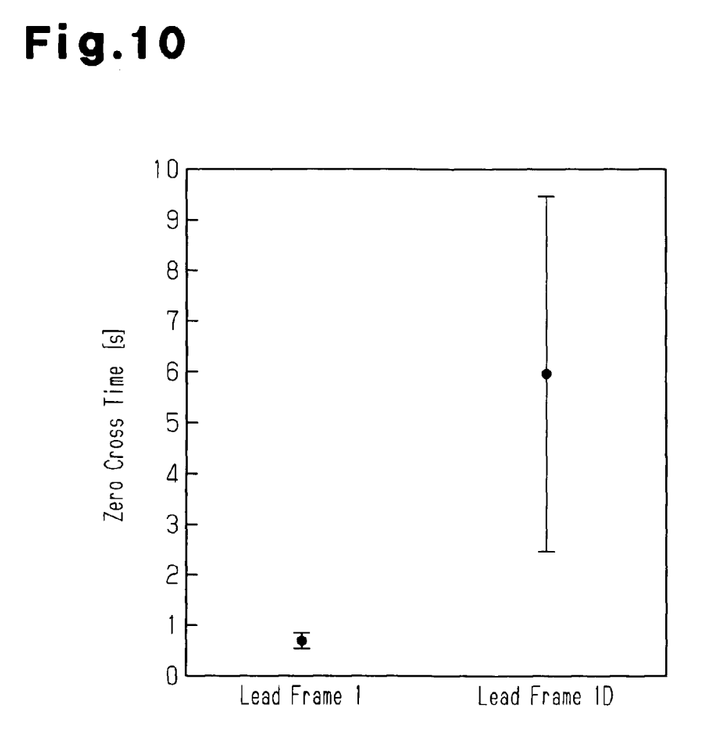
FIG. 10 is a graph showing the result of a solder wettability evaluation.

Type of solder bath: 64% Sn—Pb eutectic solder
    Type of flux: inactive rosin based flux
    Test temperature: 215° C.
    Immersing speed: 2 mm/second
    Immersing depth: 0.5 mm
    Immersing time: 10 seconds FIG. 10 shows the results of the meniscograph test. A shorter zero cross time indicates that the solder wettability is improved.

From the results of FIG. 10, it is apparent that the lead frame 1D (sulfurized lead frame) including the Ag plating layer on the outer leads has a longer zero cross time than the lead frame 1 having no Ag plating layer on the outer leads. Further, the solder wettability of the lead frame 1D is poor compared with the lead frame 1.

As apparent from the experimental results described above, when the Ag plating layer is present on the outer leads, the outer lead is apt to being sulfurized, and the solder wettability deteriorates.

Thus, in the lead frame 1 of the present embodiment, as shown in FIG. 2, the third plating layer 13 (Ag plating layer) is not formed on the outer leads 8. Instead, the three-layer plating 15B is formed on the outer leads 8. This prevents the first and second problems from arising.

The present embodiment has the advantages described below.

(1) The four-layer plating 15A, which includes the first to fourth plating layers 11 to 14, is formed on the substrate frame 2 (the inner lead 7) in the wire-bonded portion. The hardness of the surface layer of the inner lead 7 is decreased by the third plating layer 13, which is formed from Ag, and the fourth plating layer 14, which is formed from Au. This suppresses slipping of the bonding wires 22 (Cu wires) when bonding is performed. Consequently, the bonding wire connection reliability is improved. Accordingly, even when Cu wires are used for wire bonding, the Cu wires have a good wire bonding property.

(2) The four-layer plating 15A, which includes the first to fourth plating layers 11 to 14, is formed entirely on the region sealed by the sealing resin 23 (upper, lower, and side surfaces of the die pad 3 and the inner leads 7) in the substrate frame 2. This suppresses the delamination of the lead frame 1 and the sealing resin 23 and improves the reliability of the semiconductor device 20.

(3) The three-layer plating 15B, which does not include the third plating layer 13, is formed on the region of the substrate frame 2 exposed from the sealing resin 23 (i.e., the outer leads 8). This prevents problems that would arise when an Ag plating layer is present on the outer leads 8, such as the occurrence of land delamination and cracking and deterioration in the solder wettability due to sulfurization.

It should be apparent to those skilled in the art that the present invention may be embodied in many other specific forms without departing from the scope of the invention. Particularly, it should be understood that the present invention may be embodied in the following forms.

Figure 11:
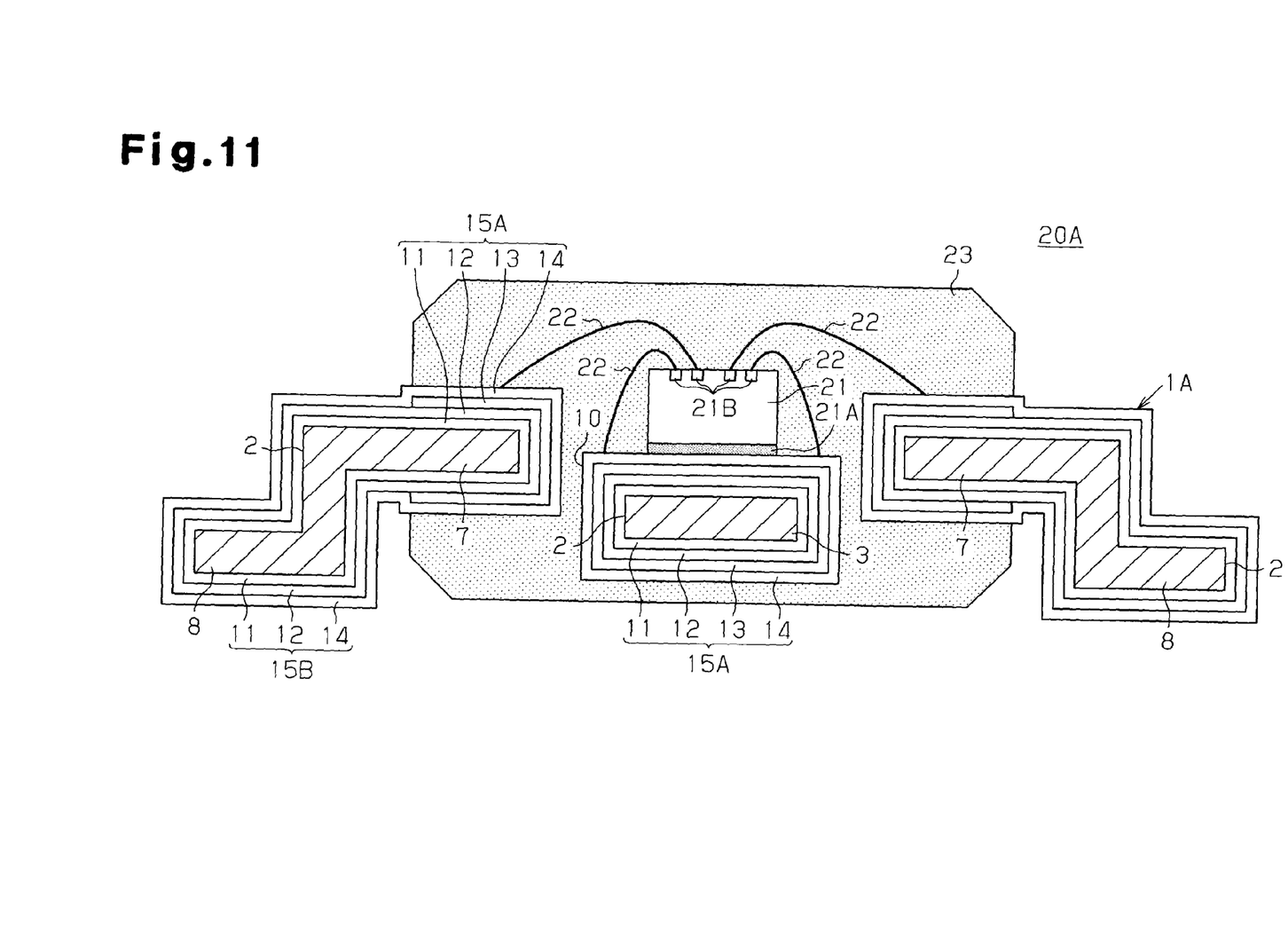
FIG. 11 is a cross-sectional view showing a modified semiconductor device.

As shown in FIG. 11, a lead frame 1A of a semiconductor device 20A, the die pad 3 may be electrically connected to the electrodes 21B of the semiconductor element 21 by each of the bonding wires 22 (e.g., Cu wires). More specifically, the bonding wires 22 may connect the electrodes 21B of the semiconductor element 21 to the four-layer plating 15A formed on the die pad 3.

Figure 12:
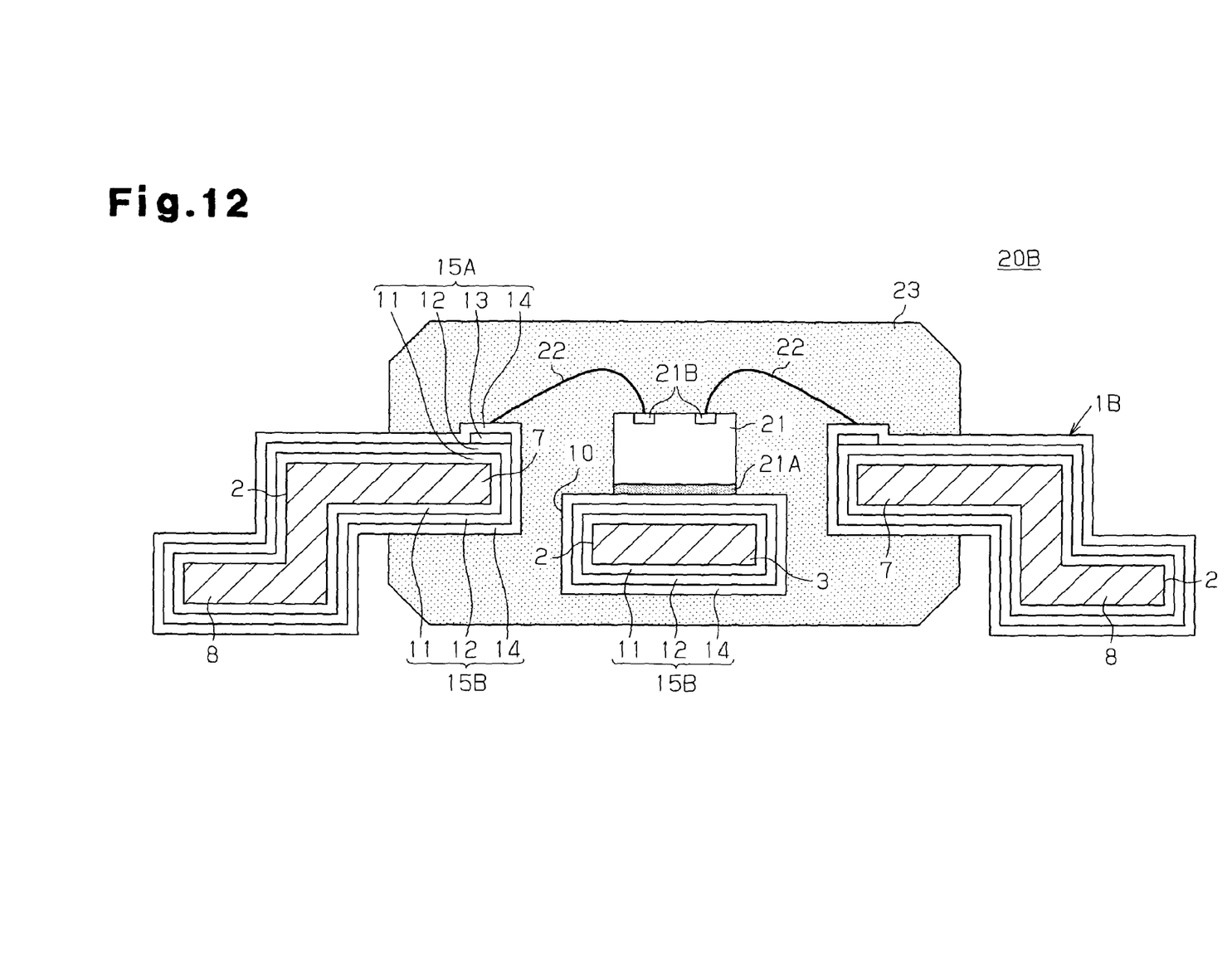
FIG. 12 is a cross-sectional view showing a modified semiconductor device.

In the above embodiment, the four-layer plating 15A is formed entirely on the die pad 3 and the inner leads 7 that are sealed by the sealing resin 23. However, the present invention is not limited in such a manner. For example, as shown in the lead frame 1B and the semiconductor device 20B of FIG. 12, the four-layer plating 15A, which includes the third plating layer 13 (Ag plating layer), may be applied to only portions connected to the bonding wire 22 (bonding portion) in the region sealed by the sealing resin 23. In this case, the three-layer plating 15B is applied to the substrate frame 2 (the die pad 3 and the inner lead 7) other than the bonding portion in the region sealed by the sealing resin 23. This structure obtains advantage (1) of the above embodiment.

Figure 13:
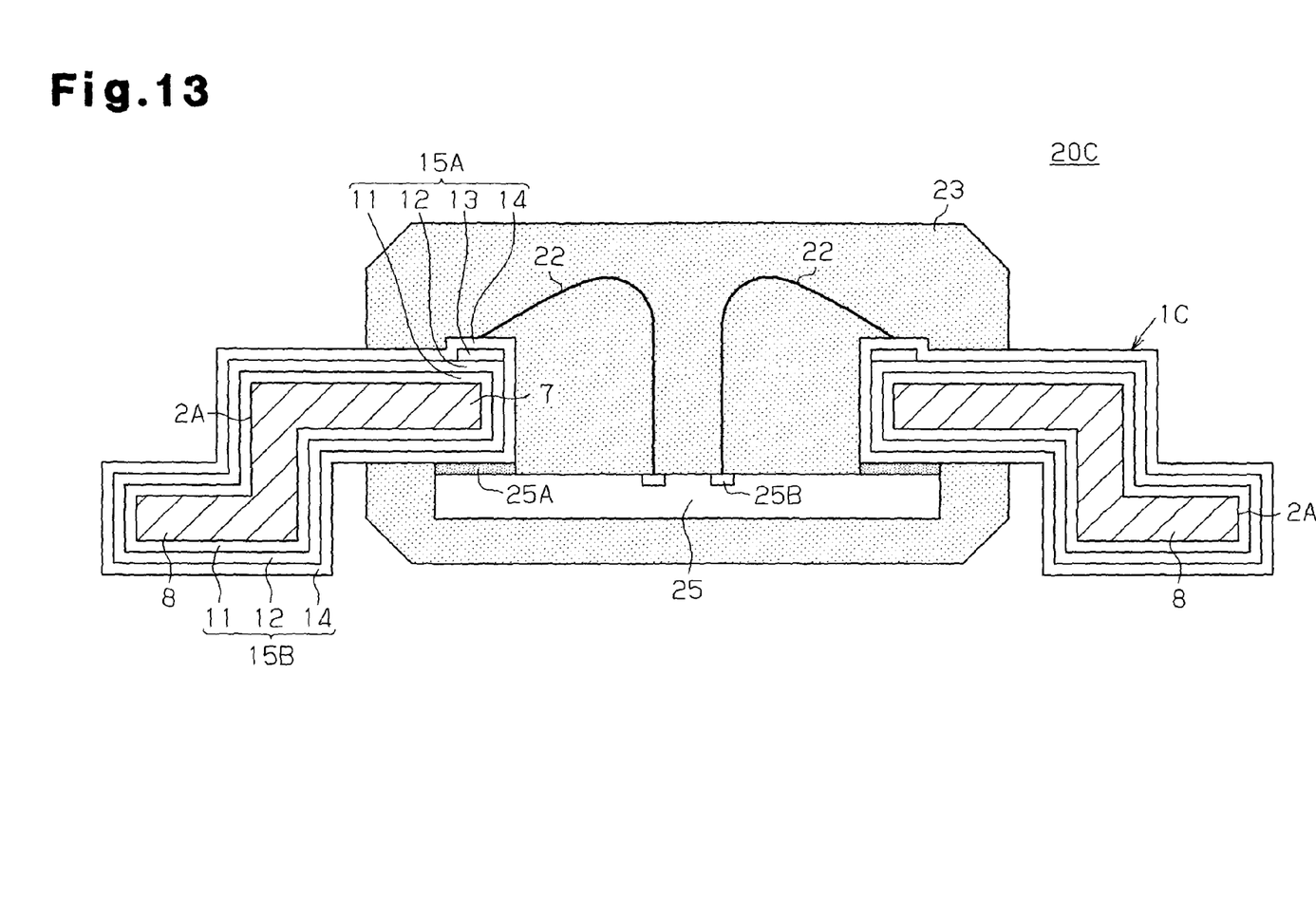
FIG. 13 is a cross-sectional view showing a modified semiconductor device.

In the above embodiment, the semiconductor device 20 includes the lead frame 1, which is used for QFP, and forms a QFP structure. However, the present invention is not limited in such a manner. For example, as shown in FIG. 13, the present invention may be embodied in a semiconductor device 20C including a lead frame 1C for Lead On Chip (LOC) and forming an LOC package structure. In the semiconductor device 20C, an adhesive film 25A is adhered to lower surfaces of the inner leads 7, and a semiconductor element 25 is adhered to the adhesive film 25A so that the semiconductor element 25 is supported by the lead frame 1C (substrate frame 2A). Further, the electrodes 25B of the semiconductor element 25 are electrically connected to the inner leads 7 by the bonding wires 22. The inner leads 7, the semiconductor element 25, which is supported by the inner leads 7, and the bonding wires 22 are sealed by the sealing resin 23. The substrate frame 2A of the lead frame 1C includes the inner leads 7 and the outer leads 8 but does not include a die pad.

In the lead frame 1C used in the semiconductor device 20C having such a structure, the four-layer plating 15A is formed on the substrate frame 2A in at least the wire bonding portion of the region to be sealed by the sealing resin 23, and the three-layer plating 15B is formed in the portion of the substrate frame 2A exposed from the sealing resin 23 (i.e., the outer leads 8). This structure also obtains advantage (1) of the above embodiment. The four-layer plating 15A may also be formed in the substrate frame 2A over the entire region to be sealed by the sealing resin 23 (i.e., the inner leads 7).

Figure 14:
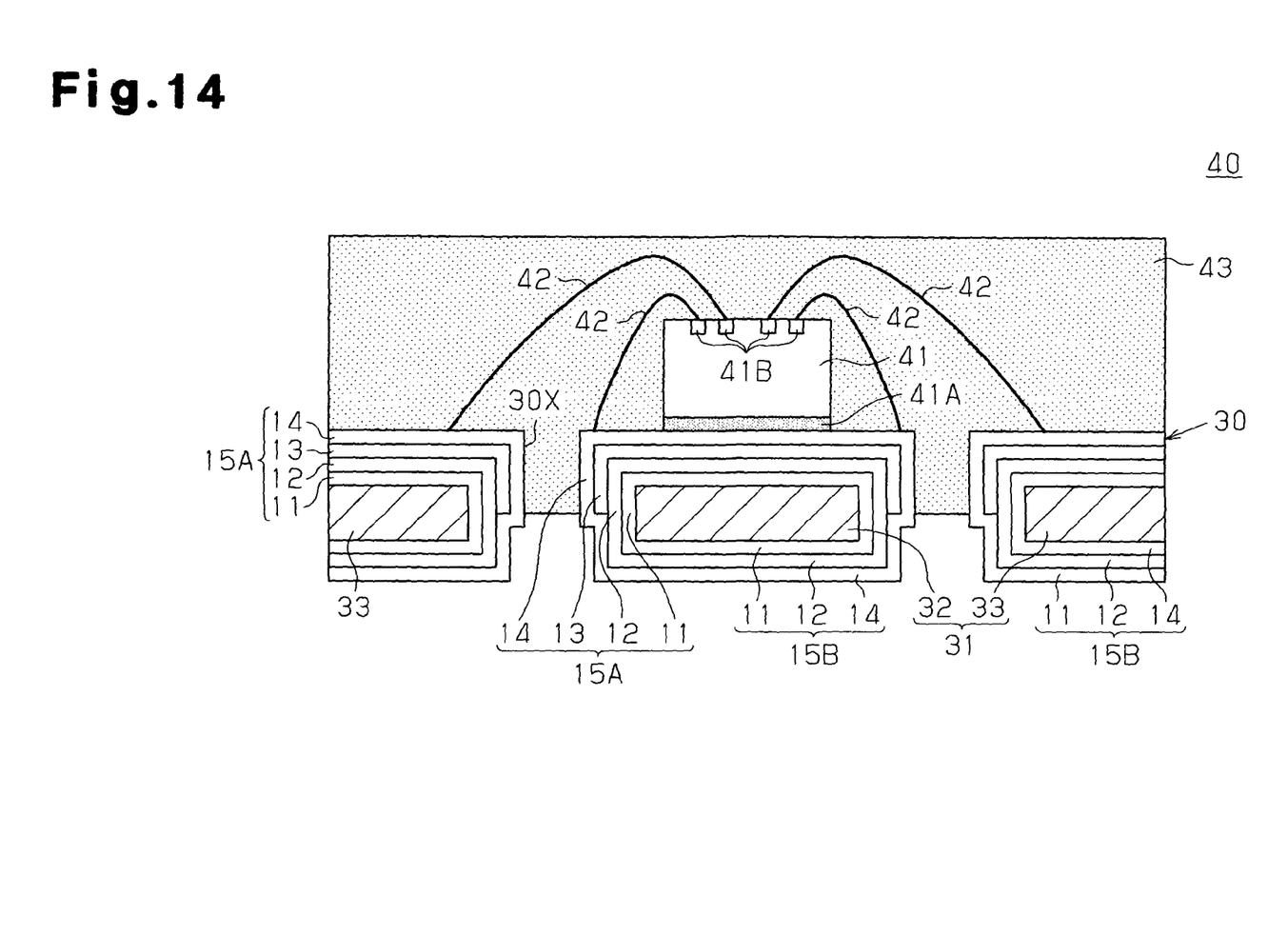
FIG. 14 is a cross-sectional view showing a modified semiconductor device.

As shown in FIG. 14, for example, the present invention may be embodied in a semiconductor device 40 including a lead frame 30 for a quad flat non-leaded to be used in Quad Flat Non-leaded Package (QFN) and forming a QFN package structure. In the lead frame 30, openings 30X are arranged at predetermined locations (two locations in the illustrated example). A substrate frame 31 of the lead frame 30 includes a die pad 32 and a plurality of leads 33 arranged around the die pad 32. The openings 30X defined the die pad 32 and the leads 33. The semiconductor device 40 includes the lead frame 30, a semiconductor element 41 mounted on the die pad 32, bonding wires 42 electrically connecting electrodes 41B of the semiconductor element 41 to the leads 33, and a sealing resin 43 covering the semiconductor element 41, the bonding wire 42, and part of the substrate frame 31. The sealing resin 43 is filled into the openings 30X from one side of the lead frame 30 (in the illustrated example, the upper side) to have a thickness that is less than the thickness of the lead frame 30 by a predetermined amount. The leads 33 exposed from the sealing resin 43 serve as a mounting surface onto which a mounting substrate such as a printed wiring board is soldered.

In the lead frame 30 used in the semiconductor device 40 having such a structure, the four-layer plating 15A is formed on the die pad 32 and the leads 33 in the region to be sealed by the sealing resin 43, and the three-layer plating 15B is formed on the die pad 32 and the leads 33 in the region exposed from the sealing resin 43. Such a structure, also obtains the same advantages as the above embodiment. In the region to be sealed by the sealing resin 43, when the four-layer plating 15A is formed in at least the portion in which the bonding wires 42 are wire-bonded, advantage (1) of the embodiment is obtained.

The present invention may also be embodied in a resin-seal type semiconductor device including a different package structure, such as a Ball Grid Array (BGA), a Land Grid Array (LGA), and the like, or a lead frame used in such a semiconductor device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the scope of the invention.

The invention claimed is:

1. A lead frame for a resin-seal type semiconductor device, wherein the semiconductor device includes a semiconductor element having an electrode, a bonding wire connected to the electrode of the semiconductor element, and a sealing resin covering and sealing the semiconductor element and the bonding wire, the lead frame comprising:
    a substrate frame including a plurality of leads;
    a four-layer plating applied to a portion of the substrate frame that is to be connected to the bonding wire and sealed by the sealing resin, wherein the four-layer plating includes a first plating layer, which is formed from Ni or an Ni alloy, a second plating layer, which is formed from Pd or a Pd alloy, a third plating layer, which is formed from Ag or an Ag alloy, and a fourth plating layer, which is formed from Au or an Au alloy, sequentially laminated in this order on the portion of the substrate frame; and
    a three-layer plating applied to an exposed region of the substrate frame that is exposed from the sealing resin, wherein the three-layer plating includes the first plating layer, the second plating layer, and the fourth plating layer sequentially laminated in this order on the exposed region of the substrate frame.

2. The lead frame according to claim 1, wherein the substrate frame includes a die pad onto which the semiconductor element is mounted.

3. The lead frame according to claim 1, wherein the four-layer plating is applied entirely to a sealed region of the substrate frame that is to be sealed by the sealing resin.

4. The lead frame according to claim 1, wherein the third plating layer has a thickness of 0.05 μm or greater to 3.5 μm or less.

5. The lead frame according to claim 1, wherein
    each of the plurality of leads includes an outer end and an inner end,
    the three-layer plating is applied to the outer ends of the leads, and
    the four-layer plating is applied to the inner ends of the leads.

6. A semiconductor device comprising:
    the lead frame according to claim 1;
    the semiconductor element;
    the bonding wire electrically connecting the electrode of the semiconductor element and the four-layer plating; and
    the sealing resin that covers and seals the semiconductor element, the bonding wire, and parts of the leads.

7. The lead frame according to claim 1, wherein the third plating layer and the fourth plating of the four-layer plating decrease a hardness of a surface layer of the four-layer plating of at least one of the plurality of leads to induce a plastic deformation at the surface layer of the at least one of the plurality of leads.

8. The lead frame according to claim 7, wherein the plastic deformation suppresses slipping of a Cu wire to be bonded to the surface layer of the at least one of the plurality of leads.

9. The lead frame according to claim 8, wherein the four-layer plating increases bonding reliability of the Cu wire to the surface layer of the at least one of the plurality of leads.

* * * * *